United States Patent
Yoo et al.

(10) Patent No.: US 10,312,317 B2
(45) Date of Patent: Jun. 4, 2019

(54) CHIP RESISTOR AND CHIP RESISTOR ASSEMBLY

(71) Applicant: SAMSUNG ELECTRO-MECHANICS CO., LTD., Suwon-si, Gyeonggi-do (KR)

(72) Inventors: Doo Ho Yoo, Suwon-si (KR); Jung Il Kim, Suwon-si (KR); Young Key Kim, Suwon-si (KR); Jung Min Nam, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/896,320

(22) Filed: Feb. 14, 2018

(65) Prior Publication Data
US 2018/0315810 A1   Nov. 1, 2018

(30) Foreign Application Priority Data

Apr. 27, 2017  (KR) .................. 10-2017-0054407
Jun. 12, 2017  (KR) .................. 10-2017-0073327

(51) Int. Cl.
*H05K 1/16*  (2006.01)
*H01L 49/02*  (2006.01)
(Continued)

(52) U.S. Cl.
CPC .............. *H01L 28/20* (2013.01); *H01L 23/10* (2013.01); *H01L 23/3114* (2013.01); *H05K 1/167* (2013.01)

(58) Field of Classification Search
CPC .......... H01C 1/148; H01C 1/01; H01C 1/142; H01C 7/00; H01L 28/20
See application file for complete search history.

(56) References Cited

U.S. PATENT DOCUMENTS 5,339,065 A     8/1994  Slenker
6,023,217 A  *  2/2000  Yamada ................. H01C 1/142
                                                          338/307
(Continued)

FOREIGN PATENT DOCUMENTS

JP    2004-031800 A    1/2004
JP     3971335 B2      9/2007
(Continued)

OTHER PUBLICATIONS

JP 2002-343614, Yamaki, Nov. 29, 2002, whole document. (Year: 2002).*

*Primary Examiner* — Kyung S Lee
(74) *Attorney, Agent, or Firm* — Morgan Lewis & Bockius LLP

(57) ABSTRACT

A chip resistor includes a base substrate having a first surface and a second surface opposing each other, two side surfaces connecting the first surface and the second surface, and two end surfaces connecting the first surface and the second surface, a resistive layer disposed on the second surface of the base substrate, the resistive layer having a first surface in contact with the base substrate and a second surface opposing the first surface of the resistive layer, a first terminal and a second terminal spaced apart from each other and each being connected to the resistive layer on the second surface of the resistive layer, and a third terminal connected to the resistive layer on the second surface of the resistive layer, disposed between the first terminal and the second terminal, and extending to the first surface of the base substrate along the side surfaces.

15 Claims, 7 Drawing Sheets

(51) Int. Cl.
    *H01L 23/31*     (2006.01)
    *H01L 23/10*     (2006.01)

(56) References Cited

U.S. PATENT DOCUMENTS

| | | | | |
|---|---|---|---|---|
| 6,127,722 A * | 10/2000 | Doi | ............ | H01C 1/034 |
| | | | | 257/154 |
| 6,636,143 B1 * | 10/2003 | Hashimoto | ............ | H01C 1/142 |
| | | | | 219/619 |
| 6,856,234 B2 * | 2/2005 | Kuriyama | ............ | H01C 1/142 |
| | | | | 338/309 |
| 7,098,768 B2 * | 8/2006 | Doi | ............ | H01C 1/14 |
| | | | | 338/309 |
| 9,514,867 B2 * | 12/2016 | Harada | ............ | H01C 17/006 |
| 10,083,781 B2 * | 9/2018 | Smith | ............ | H01C 1/032 |
| 2006/0273423 A1 | 12/2006 | Tsukada | | |
| 2008/0129443 A1 * | 6/2008 | Tsukada | ............ | H01C 1/148 |
| | | | | 338/309 |
| 2016/0125981 A1 | 5/2016 | Kim et al. | | |
| 2016/0172083 A1 | 6/2016 | Kim et al. | | |
| 2017/0011856 A1 | 1/2017 | Hattori et al. | | |

FOREIGN PATENT DOCUMENTS

| | | | |
|---|---|---|---|
| KR | 10-2016-0052283 A | | 5/2016 |
| KR | 10-2016-0072550 A | | 6/2016 |
| KR | 10-2017-0007161 A | | 1/2017 |

* cited by examiner

CHIP RESISTOR AND CHIP RESISTOR ASSEMBLY

CROSS-REFERENCE TO RELATED APPLICATION

This application claims the benefit of priority to Korean Patent Application Nos. 10-2017-0054407 filed on Apr. 27, 2017 and 10-2017-0073327 filed on Jun. 12, 2017 in the Korean Intellectual Property Office, the entire disclosures of which are incorporated herein by reference for all purposes.

TECHNICAL FIELD

The following description relates to a chip resistor and a chip resistor assembly.

BACKGROUND

A chip-shaped resistor is suitable for implementing a precision resistor, which may control current in a circuit, and serve to drop voltages.

In addition, the resistor may be used to connect a pattern on a printed circuit board in a designed circuit, when the printed circuit board is designed and made into a platform so that electronic components can be replaced, removed from, or added to a single printed circuit board, according to the specifications of various electronic devices.

In addition, the resistor may be used as a pull-up resistor or a pull-down resistor by connecting the pattern of the printed circuit board to the power or ground.

However, when a plurality of resistors are used for designing a circuit satisfying the specifications of an electronic device, there is a problem in that a mounting area for a plurality of resistors in a printed circuit board is necessarily increased.

In detail, it is not desirable that a mounting area occupied by the resistor in a printed circuit board be increased in accordance with the increased miniaturization and precision in electronic devices.

SUMMARY

An aspect of the present disclosure provides a chip resistor allowing for improved efficiency of a mounting area on a circuit board and which is able to be stably connected to a circuit board.

According to an aspect of the present disclosure, a chip resistor includes: a base substrate having a first surface and a second surface opposing each other, two side surfaces connecting the first surface and the second surface, and two end surfaces connecting the first surface and the second surface; a resistive layer disposed on the second surface of the base substrate, the resistive layer having a first surface in contact with the base substrate and a second surface opposing the first surface of the resistive layer; a first terminal and a second terminal spaced apart from each other and each being connected to the resistive layer on the second surface of the resistive layer; and a third terminal connected to the resistive layer on the second surface of the resistive layer, disposed between the first terminal and the second terminal, and extending to the first surface of the base substrate along the side surfaces.

According to an aspect of the present disclosure, a chip resistor assembly includes: a circuit board having a plurality of electrode pads; and a chip resistor disposed on the circuit board and electrically connected to the plurality of electrode pads. The chip resistor includes a base substrate having a first surface and a second surface opposing each other, two side surfaces connecting the first surface and the second surface, and two end surfaces connecting the first surface and the second surface, a resistive layer disposed on the second surface of the base substrate, the resistive layer having a first surface in contact with the base substrate and a second surface opposing the first surface of the resistive layer, a first terminal and a second terminal spaced apart from each other and each being connected to the resistive layer on the second surface of the resistive layer, and a third terminal connected to the resistive layer on the second surface of the resistive layer, disposed between the first terminal and the second terminal, and extending to the first surface of the base substrate along the side surfaces.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
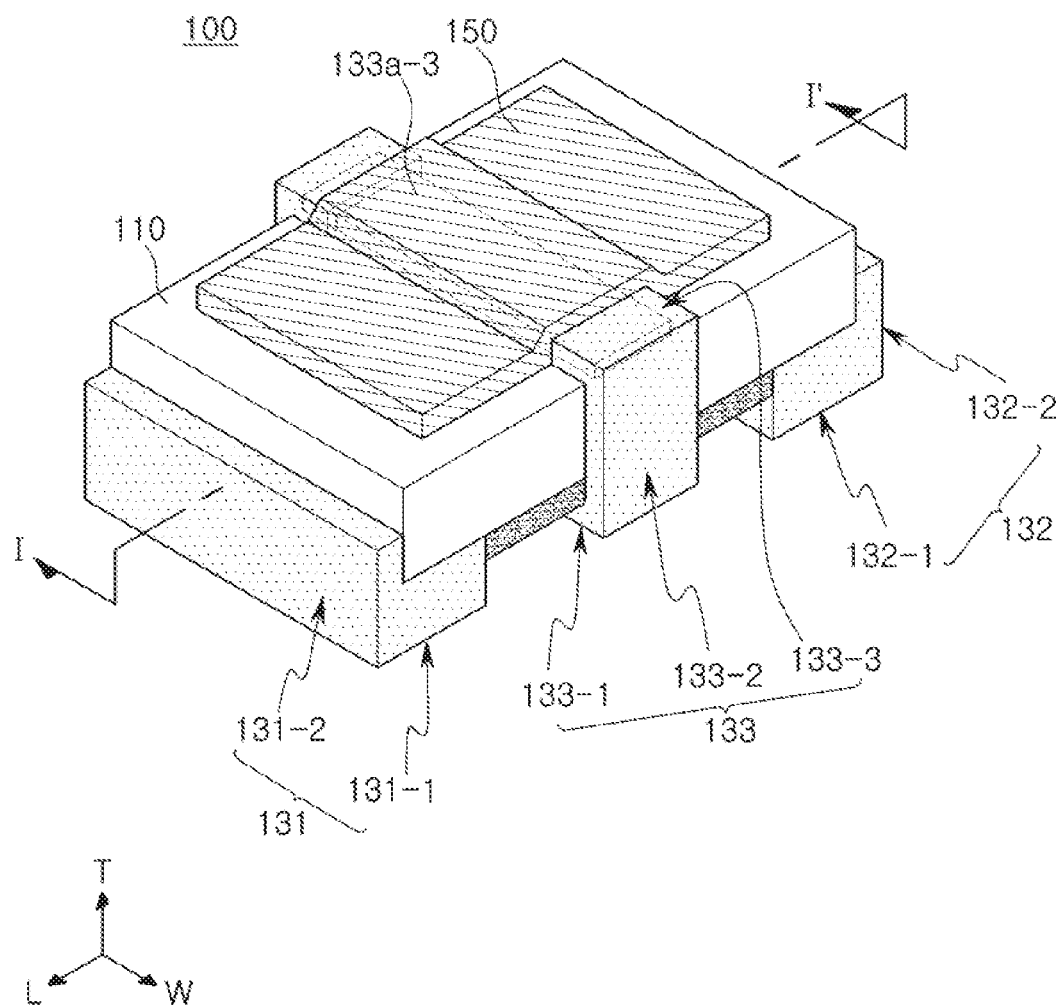
FIG. 1 is a perspective view illustrating a chip resistor according to an exemplary embodiment.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' 'upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

Figure 2:
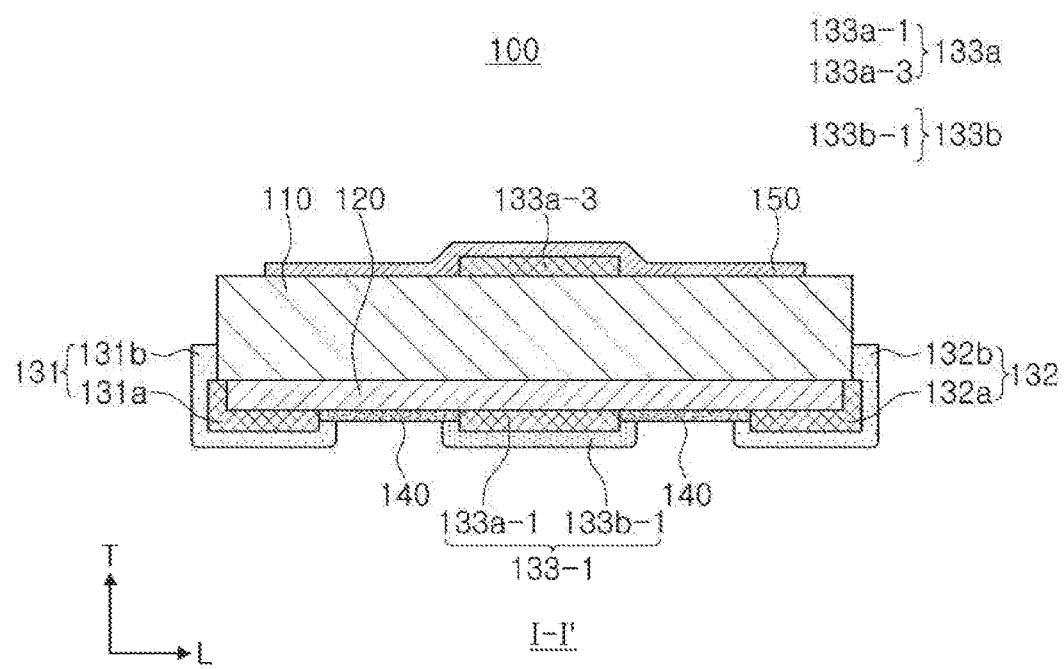
FIG. 2 is an example of a cross-sectional view taken along line I-I' of the chip resistor illustrated in FIG. 1.
Figure 3:
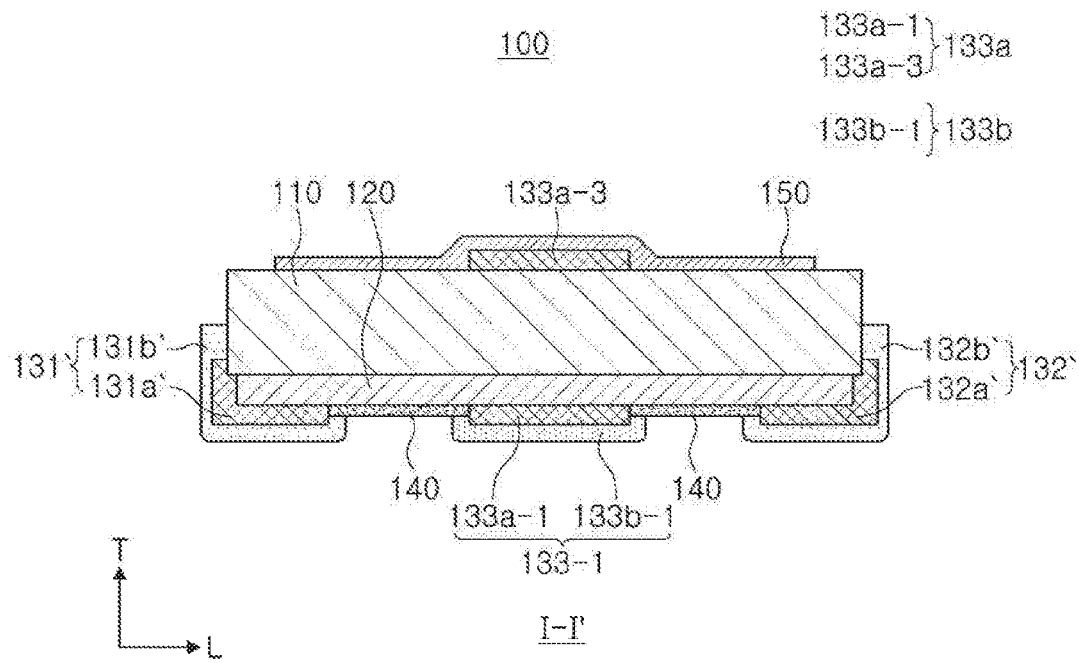
FIG. 3 is another example of a cross-sectional view taken along line I-I' of the chip resistor illustrated in FIG. 1.

FIG. 1 is a perspective view illustrating a chip resistor according to an exemplary embodiment, FIG. 2 is an example of a cross-sectional view taken along line I-I' of the chip resistor illustrated in FIG. 1, and FIG. 3 is another example of a cross-sectional view taken along line I-I' of the chip resistor illustrated in FIG. 1.

Referring to FIGS. 1 and 2, a chip resistor 100 according to an exemplary embodiment may include a base substrate 110, a resistive layer 120, a first terminal 131, a second terminal 132, and a third terminal 133. In addition, the chip resistor may further include a first protective layer 140 and a second protective layer 150.

The base substrate 110 is provided to support the resistive layer 120 and to secure strength of the chip resistor 100, and is not particularly limited. For example, the base substrate may be an insulating substrate, or the like, and may be formed of alumina of which a surface is anodized to be electrically insulated.

In addition, the base substrate 110 has a predetermined thickness, may be provided as a thin plate in which a shape of one surface is rectangular, and may have a first surface and a second surface opposing each other, two end surfaces opposing each other, and two side surfaces opposing each other.

For example, as illustrated in FIGS. 1 and 2, the first surface and the second surface may be an upper surface and a lower surface of the base substrate 110, opposing each other in a thickness direction (T). In addition, the two end surfaces are two surfaces of the base substrate 110, opposing each other in a longitudinal direction (L), and the two side surfaces are two surfaces of the base substrate 110, opposing each other in a width direction (W) of the base substrate 110.

In addition, as the base substrate 110 is formed of a material having excellent thermal conductivity, thereby serving as a thermal diffusion passage for radiating heat, generated in the resistive layer 120, externally, when a resistor is used.

The resistive layer 120 is disposed on a second surface of the base substrate. In addition, the resistive layer 120 is connected to the first terminal 131, the second terminal 132, and the third terminal 133, separated from each other, to be used as two resistance elements among the first terminal 131, the second terminal 132, and the third terminal 133. In addition, in a different manner from an exemplary embodiment, the resistive layer 120 may be provided to be divided into two resistance elements.

For example, in the resistive layer 120, a resistance value may be determined by trimming. Trimming refers to a process such as cutting for fine adjustment of a resistance value, and may be a process of determining a resistance value set in each resistance portion when a circuit is designed.

The resistive layer 120 is not particularly limited, and may include various metals, an alloy, or a compound such as an oxide. For example, the resistive layer may include at least one among a Cu—Ni-based alloy, a Ni—Cr-based alloy, a Ru oxide, a Si oxide, Mn, and a Mn-based alloy.

Each of a first terminal 131 and a second terminal 132 is connected to the resistive layer 120 and is disposed to be separated from each other on the second surface of the base substrate 110. For example, as illustrated in FIGS. 1 and 2, the first terminal 131 and the second terminal 132 may include portions 131-1 and 132-1, disposed on both sides of a lower surface of the base substrate 110, and portions 131-2 and 132-2 extended to end surfaces of the base substrate 110. In the form described above, the first terminal 131 and the second terminal 132 cover one end and the other end of the resistive layer 120, respectively. In addition, the first terminal 131 and the second terminal 132 are extended to end surfaces of the base substrate 110, respectively, and may cover edges at which a lower surface of the base substrate 110 and end surfaces meet.

A third terminal 133 is disposed between the first terminal 131 and the second terminal 132 on the second surface of the base substrate 110, and is connected to the resistive layer 120. In addition, the third terminal 133 is extended to the first surface along the two side surfaces of the base substrate 110.

As illustrated in FIGS. 1 and 2, the third terminal 133 may include a lower surface portion 133-1, as a portion disposed on a lower surface of the base substrate 110, a side surface portion 133-2, as a portion disposed on a side surface of the base substrate 110, and an upper surface portion 133-3, as a portion disposed on an upper surface of the base substrate 110.

In the form described above, the third terminal 133 is extended from a lower surface of the base substrate 110 along a side surface to an upper surface of the base substrate 110.

In a case in which the third terminal 133 has a structure extended from a lower surface only to a side surface, a problem in which the third terminal 133 is separated from a side surface of the base substrate 110 due to external impacts may occur. The chip resistor 100 according to an exemplary embodiment has an integrated structure in which the third terminal 133 is extended from a lower surface of the base substrate 110 along a side surface to an upper surface, thereby having an effect of improving bonding strength between the third terminal 133 and the base substrate 110.

In detail, the first terminal 131, the second terminal 132, and the third terminal 133 may include a first electrode layer 131a, a second electrode layer 132a, and a third electrode layer 133a, disposed on the resistive layer 120, respectively, as well as a first plating layer 131b, a second plating layer 132b, and a third plating layer 133b, disposed on the first electrode layer 131a, the second electrode layer 132a, and the third electrode layer 133a, respectively.

For example, as illustrated in FIG. 2, the first terminal 131 may include the first electrode layer 131a and the first plating layer 131b, the second terminal 132 may include the second electrode layer 132a and the second plating layer 132b, and the third terminal 133 may include the third electrode layer 133a and the third plating layer 133b.

The first electrode layer 131a, the second electrode layer 132a, and the third electrode layer 133a are disposed to be separated from each other on one surface of the resistive layer 120, and the third electrode layer 133a may be disposed between the first electrode layer 131a and the second electrode layer 132a. In addition, each of the first electrode layer 131a, the second electrode layer 132a, and the third electrode layer 133a may be connected to the resistive layer 120. In addition, the first electrode layer 131a and the second electrode layer 132a may be disposed to cover both sides of the resistive layer 120.

The first electrode layer 131a, the second electrode layer 132a, and the third electrode layer 133a are not particularly limited, and may be formed using a method of applying a conductive paste for formation of a conductive electrode to the resistive layer 120. In addition, a method such as screen printing, or the like, may be used as an application method.

In addition, the first electrode layer 131a, the second electrode layer 132a, and the third electrode layer 133a may be used as a seed of a plating process for formation of the first plating layer 131b, the second plating layer 132b, and the third plating layer 133b.

The first electrode layer 131a, the second electrode layer 132a, and the third electrode layer 133a may be formed of a conductive paste, a different material from the resistive layer 120 described previously, or may be formed of the same material as the resistive layer 120 as needed.

Referring to FIG. 3, a first electrode layer 131a' and a second electrode layer 132a' cover both sides of a resistive layer 120, and may cover edges at which a lower surface of the base substrate 110 and end surfaces meet. Thus, a first terminal 131' and a second terminal 132', including a first plating layer 131b' and a second plating layer 132b', may be formed to be higher than the first terminal 131 and the second terminal 132, illustrated in FIG. 2, along an end surface based on a lower surface of the base substrate 110.

Meanwhile, as described above, the third terminal 133 may include the lower surface portion 133-1 and the side surface portion 133-2, and each of the lower surface portion 133-1 and the side surface portion 133-2 may include the third electrode layer 133a and the third plating layer 133b.

In addition, a portion of the third electrode layer 133a may be formed using a deposition process.

In detail, a portion of the third electrode layer 133a disposed on a side surface of the base substrate 110 and forming the side surface portion 133-2 may be formed using a deposition process on a side surface of the base substrate 110.

As described above, the third terminal 133 may include the third electrode layer 133a disposed on not only a second surface of the base substrate 110 but also on a side surface of the base substrate 110.

Thus, the third terminal 133 may be formed to be higher than the first terminal 131 and the second terminal 132 along a side surface based on a lower surface of the base substrate 110, and may secure a bonding area with a solder in the side surface of the base substrate 110.

During a soldering process, an excessive solder phenomenon, where an excessive amount of solder is used and is then formed in an unnecessary location around an electrode pad, may occur. A solder ball formed due to the solder in excess phenomenon may cause a short circuit between electrode pads, thereby causing product malfunctioning and overcurrents.

A chip resistor according to an exemplary embodiment may prevent the solder in excess phenomenon from occurring, and may allow an electrode pad and a third terminal, disposed on a circuit board, to have sufficient adhesion strength therebetween.

Table 1 illustrates data of Experimental Example 1 in which whether amounting state of a chip resistor is appropriate is determined through testing, depending on the presence or absence of a side surface portion.

TABLE 1

| | | PRESENCE OR ABSENCE OF SIDE TERMINAL | | | | | | | | | |
|---|---|---|---|---|---|---|---|---|---|---|---|
| PSR BETWEEN | | ABSENCE OF SIDE TERMINAL | | | | | PRESENCE OF SIDE TERMINAL | | | | |
| ELECTRODE PADS | | 1 TIME | 2 TIME | 3 TIME | 4 TIME | 5 TIME | 1 TIME | 2 TIME | 3 TIME | 4 TIME | 5 TIME |
| ABSENCE OF PSR | NUMBER OF SAMPLES[ea] | 1000 | 1000 | 1000 | 1000 | 1000 | 1000 | 1000 | 1000 | 1000 | 1000 |
| | NUMBER OF DEFECTS (NG)[ea] | 0 | 0 | 1 | 1 | 0 | 0 | 0 | 0 | 0 | 0 |
| | DEFECT RATE [%] | 0.00% | 0.00% | 0.10% | 0.10% | 0.00% | 0.00% | 0.00% | 0.00% | 0.00% | 0.00% |

TABLE 1-continued

|  |  | PRESENCE OR ABSENCE OF SIDE TERMINAL | | | | | | | | | |
|---|---|---|---|---|---|---|---|---|---|---|---|
| PSR BETWEEN ELECTRODE PADS | | ABSENCE OF SIDE TERMINAL | | | | | PRESENCE OF SIDE TERMINAL | | | | |
| | | 1 TIME | 2 TIME | 3 TIME | 4 TIME | 5 TIME | 1 TIME | 2 TIME | 3 TIME | 4 TIME | 5 TIME |
| PRESENCE OF PSR | NUMBER OF SAMPLES[ea] | 1000 | 1000 | 1000 | 1000 | 1000 | 1000 | 1000 | 1000 | 1000 | 1000 |
| | NUMBER OF DEFECTS (NG)[ea] | 436 | 518 | 635 | 428 | 521 | 0 | 0 | 0 | 0 | 0 |
| | DEFECT RATE [%] | 43.6% | 51.8% | 63.5% | 42.8% | 52.1% | 0.0% | 0.0% | 0.0% | 0.0% | 0.0% |

In Experimental Example 1, a chip resistor in which a third terminal 133 includes a side surface portion 133-2 and a chip resistor not including a side surface portion were mounted in an amount of 1000 pieces per unit (Lot, times) using a reflow process on an electrode pad of a printed circuit board. In this case, the occurrence of a solder in excess phenomenon or a cold solder joint phenomenon was determined as being a defect (NG) as a result.

Referring to Table 1, when a chip resistor not including a side surface portion is mounted on a printed circuit board, it was confirmed that a defect has occurred. In detail, when the chip resistor not including a side surface portion is mounted on a printed circuit board, in which Photo Imageable Solder Resist (PSR) ink is applied between electrode pads to which the first terminal 131, the second terminal 132, and the third terminal 133 are bonded by a solder, a defect rate is significantly high.

In a chip resistor according to an exemplary embodiment, a defect, occurring in the chip resistor not including a side surface portion, did not occur.

In detail, the third electrode layer 133a may include a third lower electrode layer 133a-1, a third side surface electrode layer, and a third upper electrode layer 133a-3. The third lower electrode layer 133a-1, the third side surface electrode layer, and the third upper electrode layer 133a-3 act as a seed during a plating process, so the third plating layer 133b may be formed on the third side surface electrode layer and the third upper electrode layer 133a-3 while including a third lower plating layer 133b-1 formed on the third lower electrode layer 133a-1.

As described above, in the chip resistor 100 according to an exemplary embodiment, the third terminal 133 may include the upper surface portion 133-3 to have an integrated form in which the third terminal 133 is extended from a lower surface of the base substrate 110 along a side surface to an upper surface.

Table 2 illustrates data of Experimental Example 2 in which whether a state of a chip resistor is appropriate is tested depending on the presence or absence of an upper surface portion.

TABLE 2

|  |  | PRESENCE OR ABSENCE OF UPPER TERMINAL | | | | | | | | | |
|---|---|---|---|---|---|---|---|---|---|---|---|
| TEST LIST | | ABSENCE OF SIDE TERMINAL | | | | | PRESENCE OF SIDE TERMINAL | | | | |
| | | 1 TIME | 2 TIME | 3 TIME | 4 TIME | 5 TIME | 1 TIME | 2 TIME | 3 TIME | 4 TIME | 5 TIME |
| TAPING TEST | NUMBER OF SAMPLES [ea] | 1000 | 1000 | 1000 | 1000 | 1000 | 1000 | 1000 | 1000 | 1000 | 1000 |
| | NUMBER OF DEFECTS (NG)[ea] | 8 | 8 | 11 | 9 | 8 | 0 | 0 | 0 | 0 | 0 |
| | DEFECT RATE [%] | 0.80% | 0.80% | 1.10% | 0.90% | 0.80% | 0.00% | 0.00% | 0.00% | 0.00% | 0.00% |
| IMPACT TEST AFTER MOUNTING | NUMBER OF SAMPLES [ea] | 600 | 600 | 600 | 600 | 600 | 600 | 600 | 600 | 600 | 600 |
| | NUMBER OF DEFECTS (NG)[ea] | 23 | 19 | 32 | 24 | 26 | 0 | 0 | 0 | 0 | 0 |
| | DEFECT RATE [%] | 3.83% | 3.17% | 5.33% | 4.00% | 4.33% | 0.0% | 0.0% | 0.0% | 0.0% | 0.0% |

In Experimental Example 2, with respect to a chip resistor in which a third terminal 133 includes an upper surface portion 133-3 and a chip resistor not including an upper surface portion, a result of conducting a taping test and an impact test after mounting is illustrated.

In detail, the taping test is a test in which an impact is applied to a chip resistor when the chip resistor is inserted into a tape as alignment thereof is shifted during a taping process of packaging a chip resistor, and the impact test after mounting is a test in which an impact is applied to a chip resistor, having been mounted, as the chip resistor is mounted, a plurality of printed circuit boards are stacked, and constant shaking is applied thereto.

The test was conducted with respect to a chip resistor mounted in an amount of 1000 pieces per unit (Lot, times). In this case, the occurrence of a phenomenon in which a third terminal 133 is separated from a side surface of a base substrate 110 was determined as being a defect (NG).

Referring to Table 2, in a chip resistor not including an upper surface portion, a defect occurred. However, in a chip resistor according to an exemplary embodiment, the defect, occurring in the chip resistor not including an upper surface portion 133-3, did not occur.

In addition, the first protective layer 140 for protecting the resistive layer 120 from external impacts may be disposed on a surface of the resistive layer 120 in which a first electrode layer 131a, a second electrode layer 132a, and a third electrode layer 133a are not disposed.

The first protective layer 140 is not particularly limited, and may be formed of a silicon (SiO$_2$) or glass material, and may be formed on the resistive layer 120 and the base substrate 110 by overcoating.

In a specific example, the first protective layer 140 may include an inner protective layer, a glass, and an outer protective layer, a polymer. As required, the inner protective layer is formed before a trimming process, thereby preventing a crack from being generated in the resistive layer 120 during the trimming process, and the outer protective layer is formed after the trimming process, thereby protecting the resistive layer 120.

Meanwhile, even when the first protective layer 140 is disposed on the resistive layer 120 and the base substrate 110, the first terminal 131, the second terminal 132, and the third terminal 133 have a shape protruding more further than the first protective layer 140. Thus, when being mounted on a board, the first terminal 131, the second terminal 132, and the third terminal 133 may be allowed to be easily in contact with an electrode pad disposed on the board.

In addition, the second protective layer 150 may be disposed on a first surface of the base substrate 110. The second protective layer 150 may protect the chip resistor 100 from external impacts. For example, the second protective layer 150 may have a predetermined height in order to prevent impacts from the top of the chip resistor 100 from being applied to the side surface portion 133-2 of the third terminal.

In addition, the second protective layer 150 may be formed using a method of applying an insulating material. In addition, a method such as screen printing, or the like, may be used as an application method.

Meanwhile, the second protective layer 150 may be applied after the third upper electrode layer 133a-3 is formed, and a plating process may be performed thereafter. Thus, the third plating layer 133b formed using the plating process may be formed in the third upper electrode layer 133a-3 except for a portion in which the second protective layer 150 is applied.

Meanwhile, the third upper electrode layer 133a-3 may be formed by printing a conductive paste.

Figure 4:
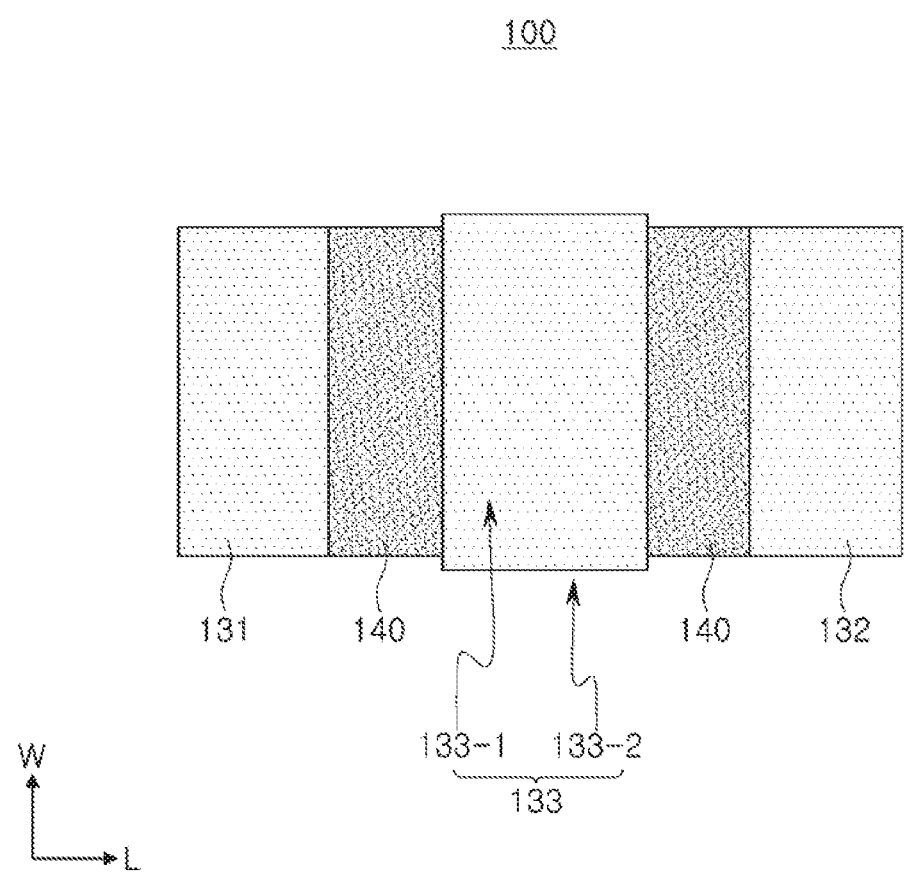
FIG. 4 is a bottom view of the chip resistor illustrated in FIG. 1.

FIG. 4 is a bottom view of the chip resistor illustrated in FIG. 1.

Referring to FIG. 4, a chip resistor may include a first terminal 131, a second terminal 132, and a third terminal 133. In addition, the chip resistor may further include a first protective layer 140.

Here, third terminal 133 may include not only a portion 133-1 disposed between the first terminal 131 and the second terminal 132 in a lower surface of a base substrate, but also a portion 133-2 extended to a side surface of the base substrate. Thus, a contact area with a solder may be secured during a reflow process, and a stable connection with a circuit board may be secured.

Figure 5:
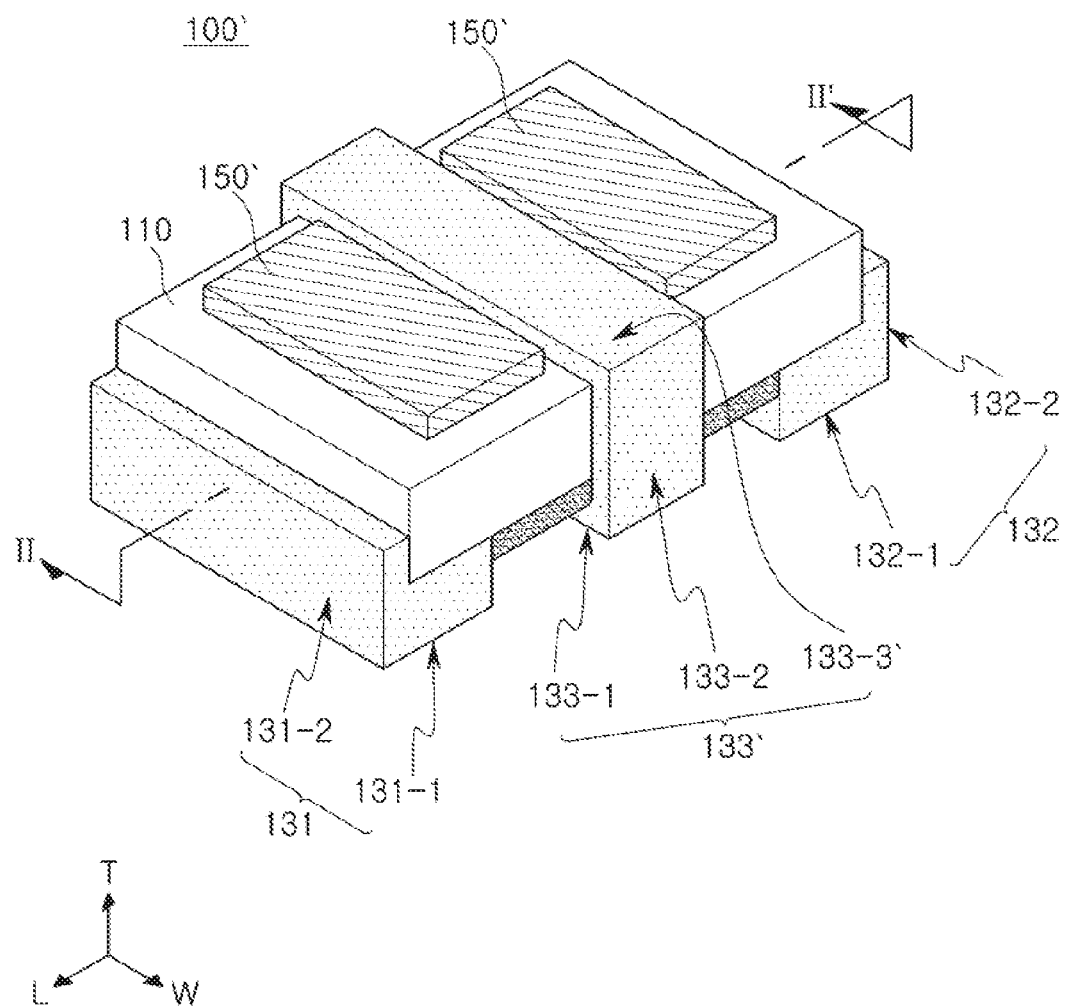
FIG. 5 is a perspective view of a chip resistor according to an exemplary embodiment.
Figure 6:
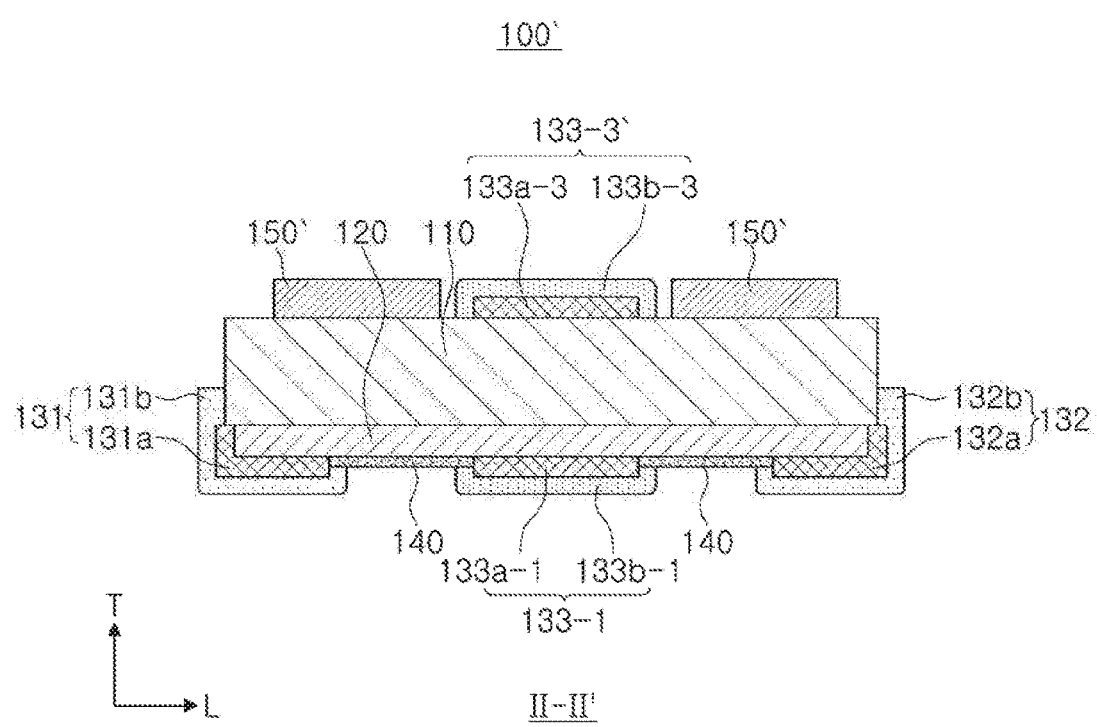
FIG. 6 is a cross-sectional view taken along line II-II' of the chip resistor illustrated in FIG. 5.

FIG. 5 is a perspective view illustrating a chip resistor according to an exemplary embodiment, and FIG. 6 is a cross-sectional view taken along line II-II' of the chip resistor illustrated in FIG. 5.

In a chip resistor 100' illustrated in FIGS. 5 and 6, compared to the chip resistor 100 illustrated in FIG. 1, there is a difference in that a second protective layer 150' is divided on a first surface of the base substrate 110, and a third terminal 133' is disposed between the second protective layers 150' having been divided and disposed.

In detail, the second protective layer 150' is not applied to a third upper electrode layer 133a-3' of the third terminal 133'. Thus, during a plating process, a third upper plating layer 133b-3' may be formed on the third upper electrode layer 133a-3', and the third upper plating layer 133b-3' is extended to both side surfaces of the base substrate 110.

Other configurations may be understood from the chip resistor described with reference to FIGS. 1 through 4, and redundant descriptions thereof are omitted.

Figure 7:
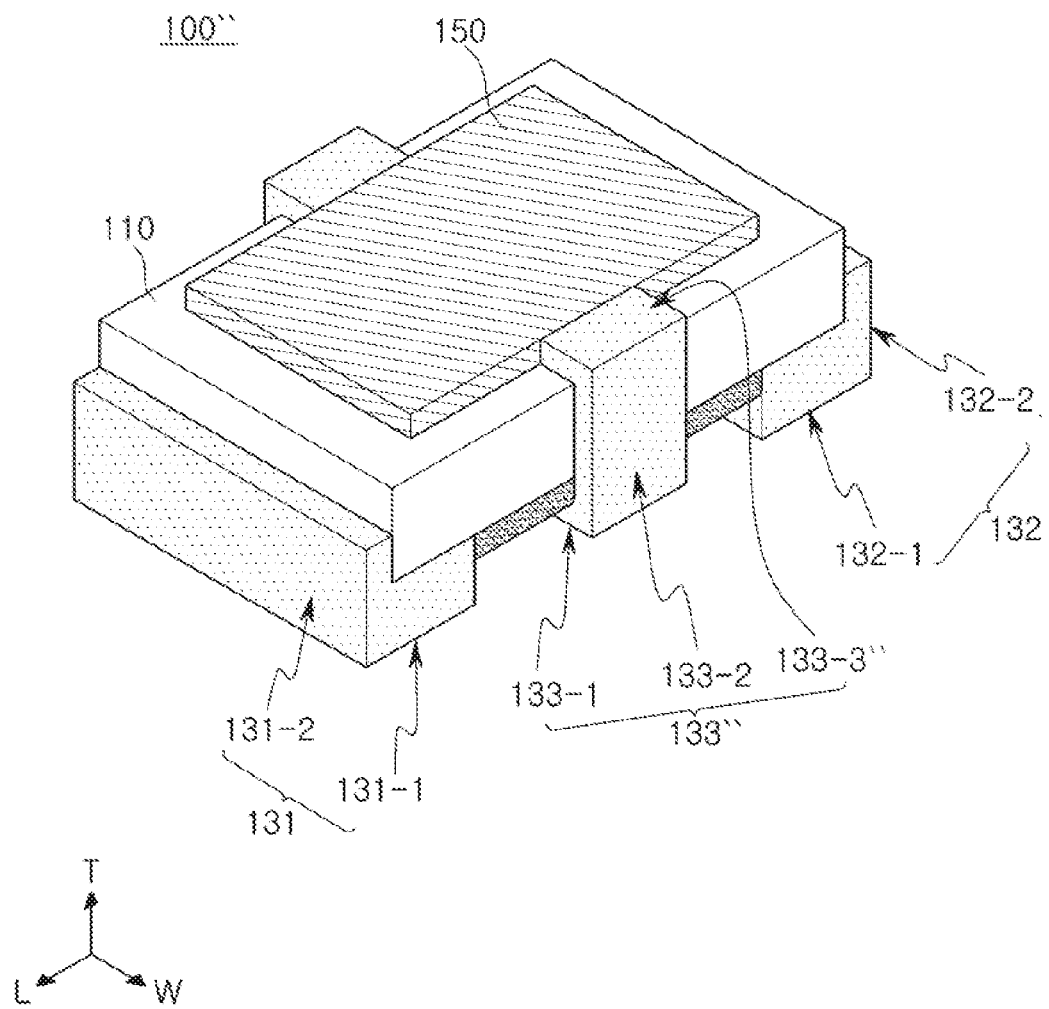
FIG. 7 is a perspective view illustrating a chip resistor according to an exemplary embodiment.

FIG. 7 is a perspective view illustrating a chip resistor according to an exemplary embodiment.

A chip resistor 100" illustrated in FIG. 7 has a difference in that a third terminal 133" is divided on a first surface of the base substrate 110, compared to the chip resistor 100 illustrated in FIG. 1.

For example, the third terminal 133" may include a lower surface portion 133-1, a side surface portion 133-2, and an upper surface portion 133-3", and the upper surface portion 133-3" may be extended from the side surface portion 133-2 and may separately disposed on both sides in a width direction (W) based on the second protective layer 150 on a first surface of the base substrate 110.

Other configurations may be understood from the chip resistor described with reference to FIGS. 1 through 4, and redundant descriptions thereof are omitted.

Figure 8:
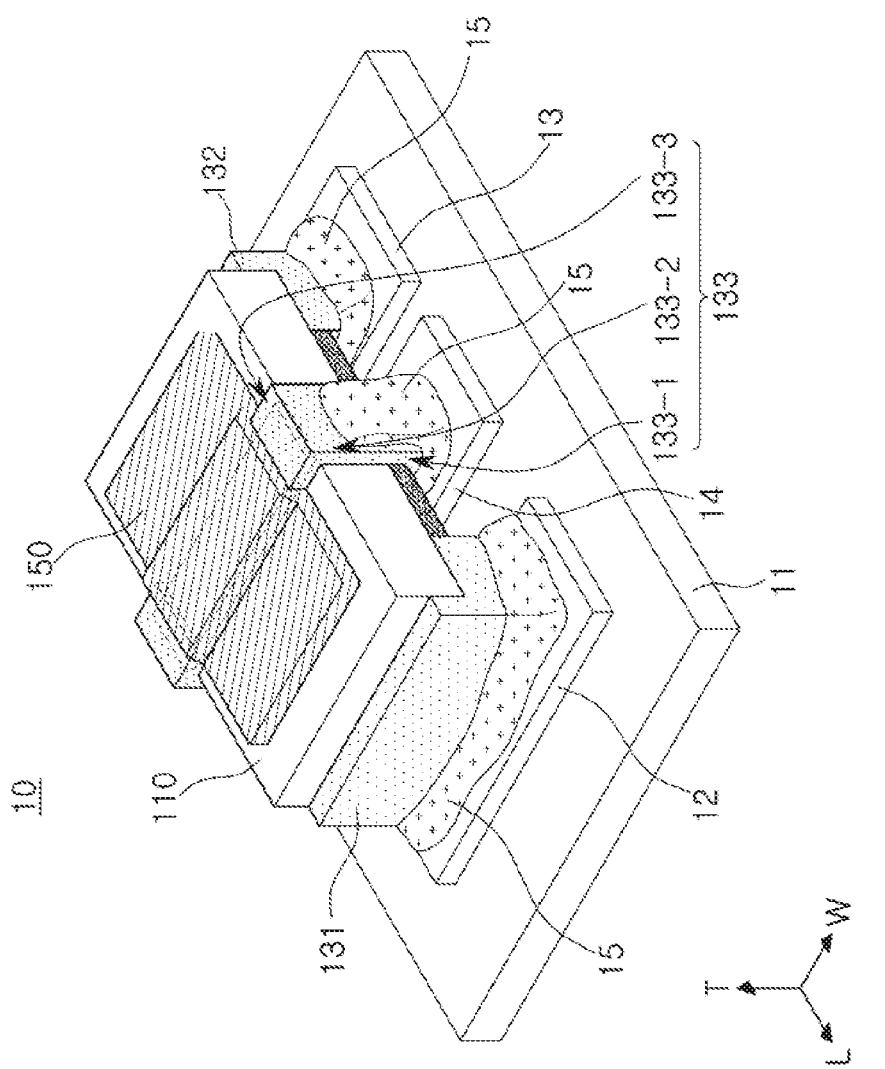
FIG. 8 is a perspective view illustrating a chip resistor assembly according to an exemplary embodiment.

FIG. 8 is a perspective view illustrating a chip resistor assembly according to an exemplary embodiment.

Referring to FIG. 8, a chip resistor assembly 10 according to an exemplary embodiment may include a plurality of electrode pads spaced apart from each other, and a circuit board 11 on which the chip resistor 100 is mounted.

The chip resistor 100 may include a base substrate 110 having a first surface and a second surface, a resistive layer disposed on the second surface of the base substrate 110, a first terminal 131 and a second terminal 132 connected to the resistive layer on the second surface and disposed to be separated from each other, and a third terminal 133 connected to the resistive layer on the second surface, disposed between the first terminal and the second terminal, and extended to the first surface along the side surface.

In addition, the third terminal 133 may include a lower surface portion 133-1, as a portion disposed on a lower surface of the base substrate 110, a side surface portion 133-2, as a portion disposed on a side surface of the base substrate 110, and an upper surface portion 133-3, as a portion disposed on an upper surface of the base substrate 110.

The chip resistor assembly 10 of FIG. 8 is illustrated as including the chip resistor 100 illustrated in FIG. 1, but the chip resistor assembly 10 may include the chip resistor 100' of FIG. 5 or may include the chip resistor 100" of FIG. 7.

The chip resistor 100 may be understood from the chip resistor described with reference to FIGS. 1 through 7, and redundant descriptions thereof are omitted.

In a circuit board 11, a portion in which an electronic circuit is formed, an integrated circuit (IC) for a specific operation or control of electronic equipment is formed therein and current supplied from a separate power source may flow.

In this case, the circuit board 11 may include various wiring lines, or may further include other types of semiconductor devices such as a transistor, or the like. In addition, the circuit board 11 may formed in various ways as required. For example, the circuit board may include a conductive layer, a dielectric layer, or the like.

A first electrode pad 12, a second electrode pad 13, and a third electrode pad 14 are disposed to be spaced apart from each other on the circuit board 11, and may be connected to the first terminal 131, the second terminal 132, and the third terminal 133 of the chip resistor 100, respectively, by a solder 15.

In FIG. 8, it is illustrated that the first electrode pad 12 is connected to the first terminal 131 and the second electrode pad 13 is connected to the second terminal 132. Alternatively, the first electrode pad 12 may be connected to the second terminal 132 and the second electrode pad 13 may be connected to the first terminal 131 depending on the design.

As illustrated in FIG. 8, the third terminal 133 may include the side surface portion 133-2 disposed on a side surface of the base substrate, and a solder electrically connecting the third electrode pad 14 to the third terminal may be disposed on a surface of the side surface portion.

Thus, the chip resistor assembly 10 according to an exemplary embodiment may prevent a defect where a solder ball is generated, and adhesion strength between the chip resistor 100 and circuit board 11 may be improved.

In addition, the third terminal 133 may include an upper surface portion 133-3 disposed on an upper surface of the base substrate and extended to the side surface portion 133-2, so durability against impacts of the third terminal 133 may be improved.

As set forth above, according to an exemplary embodiment, a chip resistor may have a high efficiency when being mounted on a board, and may be stably connected to a printed circuit board.

While exemplary embodiments have been shown and described above, it will be apparent to those skilled in the art that modifications and variations could be made without departing from the scope of the present invention as defined by the appended claims.

What is claimed is:

1. A chip resistor, comprising:
a base substrate having a first surface and a second surface opposing each other, two side surfaces connecting the first surface and the second surface, and two end surfaces connecting the first surface and the second surface;
a resistive layer disposed on the second surface of the base substrate, the resistive layer having a first surface in contact with the base substrate and a second surface opposing the first surface of the resistive layer;
a first terminal and a second terminal spaced apart from each other and each being connected to the resistive layer on the second surface of the resistive layer;
a third terminal connected to the resistive layer on the second surface of the resistive layer, disposed between the first terminal and the second terminal, and extending to the first surface of the base substrate along the side surfaces; and
a protective layer disposed on the first surface of the base substrate,
wherein the protective layer is disposed in two regions of the first surface of the base substrate, divided by the third terminal.

2. The chip resistor of claim 1, wherein the first terminal and the second terminal cover one end and the other end of the resistive layer, respectively, and are in contact with the second surface of the base substrate.

3. The chip resistor of claim 1, wherein the first terminal and the second terminal extend to the end surfaces and cover edges at which the second surface of the base substrate and the end surfaces meet, respectively.

4. The chip resistor of claim 1, wherein the third terminal includes a first surface portion disposed on the first surface of the base substrate, and the first surface portion is divided into two portions extended from the two side surfaces.

5. The chip resistor of claim 4, wherein the protective layer is disposed between the two portions of the first surface portion.

6. The chip resistor of claim 1, comprising a protective layer disposed on the second surface of the resistive layer.

7. The chip resistor of claim 1, wherein the protective layer covers a portion of the third terminal.

8. The chip resistor of claim 1, wherein the first terminal, the second terminal, and the third terminal include a first electrode layer, a second electrode layer, and a third electrode layer, respectively, as well as a first plating layer, a second plating layer, and a third plating layer, disposed on the first electrode layer, the second electrode layer, and the third electrode layer, respectively.

9. The chip resistor of claim 8, wherein a portion of the third electrode layer disposed on the side surfaces of the base substrate is formed using a deposition process.

10. The chip resistor of claim 1, wherein the first terminal and the second terminal are formed using a plating process after printing.

11. A chip resistor assembly, comprising:
a circuit board having a plurality of electrode pads;
a chip resistor disposed on the circuit board and electrically connected to the plurality of electrode pads,
wherein the chip resistor includes a base substrate having a first surface and a second surface opposing each other, two side surfaces connecting the first surface and the second surface, and two end surfaces connecting the first surface and the second surface, a resistive layer disposed on the second surface of the base substrate, the resistive layer having a first surface in contact with the base substrate and a second surface opposing the first surface of the resistive layer, a first terminal and a second terminal spaced apart from each other and each being connected to the resistive layer on the second surface of the resistive layer, a third terminal connected to the resistive layer on the second surface of the resistive layer, disposed between the first terminal and the second terminal, and extending to the first surface of the base substrate along the side surfaces, and a protective layer disposed on the first surface of the base substrate,
wherein the third terminal includes a first surface portion disposed on the first surface of the base substrate, and the first surface portion is divided into two portions extending from the two side surfaces, and
wherein the protective layer is disposed between the two portions of the first surface portion.

12. The chip resistor assembly of claim 11, wherein the first terminal and the second terminal extend to the end surfaces and cover edges at which the second surface of the base substrate and the end surfaces meet, respectively.

13. The chip resistor of claim 11, comprising a protective layer disposed on the second surface of the resistive layer.

14. The chip resistor assembly of claim 11, wherein the protective layer covers a portion of the third terminal.

15. The chip resistor assembly of claim 11, wherein the protective layer is disposed on two regions of the first surface of the base substrate, divided by the third terminal.

* * * * *